US007889511B2

(12) United States Patent
Tsai et al.

(10) Patent No.: US 7,889,511 B2
(45) Date of Patent: Feb. 15, 2011

(54) ELECTRONIC CARRIER BOARD APPLICABLE TO SURFACE MOUNT TECHNOLOGY

(75) Inventors: Fang-Lin Tsai, Taichung (TW); Ho-Yi Tsai, Taichung (TW); Wen-Tsung Tseng, Taichung (TW); Chih-Ming Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/535,397

(22) Filed: Aug. 4, 2009

(65) Prior Publication Data

US 2009/0288866 A1 Nov. 26, 2009

Related U.S. Application Data

(62) Division of application No. 11/654,273, filed on Jan. 16, 2007, now Pat. No. 7,573,722.

(30) Foreign Application Priority Data

Jan. 16, 2006 (TW) .............................. 95101563 A

(51) Int. Cl.
*H05K 7/10* (2006.01)

(52) U.S. Cl. ....................... 361/767; 361/768; 361/808; 361/811; 174/534; 174/557

(58) Field of Classification Search ................. 361/767, 361/743, 760, 762, 763, 768, 808, 811, 770, 361/752, 807; 174/534, 535, 557, 558, 569, 174/255, 250, 259, 260, 263, 527, 549; 257/780, 257/E23.021, 737, 738, 786
See application file for complete search history.

(56) References Cited

U.S. PATENT DOCUMENTS

| | | | | |
|---|---|---|---|---|
| 5,315,070 | A * | 5/1994 | Maiwald | 174/250 |
| 6,169,253 | B1 * | 1/2001 | Jairazbhoy et al. | 174/250 |
| 6,396,707 | B1 | 5/2002 | Huang et al. | |
| 6,441,316 | B1 | 8/2002 | Kusui | |
| 6,521,997 | B1 | 2/2003 | Huang et al. | |
| 7,235,887 | B2 | 6/2007 | Lee et al. | |
| 7,312,403 | B2 | 12/2007 | Yamamoto | |
| 7,465,885 | B2 | 12/2008 | Chi et al. | |
| 2005/0253231 | A1 * | 11/2005 | Liu | 257/678 |
| 2007/0145561 | A1 * | 6/2007 | Tsai et al. | 257/685 |

* cited by examiner

*Primary Examiner*—Dameon E Levi
*Assistant Examiner*—Hoa C Nguyen
(74) *Attorney, Agent, or Firm*—Peter F. Corless; Steven M. Jensen; Edwards Angell Palmer & Dodge LLP

(57) ABSTRACT

An electronic carrier board is provided, including a carrier, at least two paired bond pads formed on the carrier, and a protective layer covering the carrier. The protective layer is formed with openings corresponding in position to the two bond pads. The openings are aligned in the same direction and expose at least a first sidewall and a second sidewall of each of the two bond pads. The first sidewall is perpendicular to an alignment direction of the bond pads and the second sidewall is parallel to the alignment direction of the bond pads. A distance between the first sidewall of at least one of the bond pads and a corresponding side of a corresponding one of the openings is at least about 50 μm greater than a distance between the second sidewall of the at least one bond pad and a corresponding side of the corresponding opening.

23 Claims, 11 Drawing Sheets

41 42 422 D 430 422 42 431 d B 421 411 43 A 421 A

ELECTRONIC CARRIER BOARD APPLICABLE TO SURFACE MOUNT TECHNOLOGY

CROSS-REFERENCE TO RELATED APPLICATION(S)

This application is a divisional of copending application U.S. Ser. No. 11/654,273, filed on Jan. 16, 2007.

FIELD OF THE INVENTION

The present invention relates to electronic carrier boards, and more particularly, to an electronic carrier board applicable to surface mounted technology (SMT).

BACKGROUND OF THE INVENTION

Electronic components have been continuously designed and fabricated to have a miniaturized profile in response to the progress of integrated circuit (IC) manufacturing technology, and with provision of large-scale and highly integrated electronic circuits, IC-based products have relatively complete functionality.

Conventionally, electronic components are mounted on an electronic carrier board (such as a printed circuit board (PCB), a circuit board, or a substrate) by through hole technology (THT). The electronic components used in the THT, as not able to be further reduced in size, are considered occupying a significant amount of space on the electronic carrier board. By the THT, the electronic carrier board needs to have through holes corresponding to pins of the electronic components, such that the electronic components with the pins coupled to the through holes of the electronic carrier board actually occupy space on both sides of the electronic carrier board, and further, solder joints formed at junctions of the electronic components and the electronic carrier board are relatively large. Due to these drawbacks, the THT is no longer used in the mounting process of electronic components, but instead, surface mounted technology (SMT) becomes widely employed nowadays to effectively mount electronic components on an electronic carrier board.

Using the SMT to mount electronic components, electrical connection ends (pins) of the electronic components are bonded to a surface of an electronic carrier board on which the electronic components are mounted, such that there is no need to form plenty of through holes in the electronic carrier board for accommodating the pins of the electronic components as in the case of using the THT. Further by the SMT, the electronic components can be disposed on both sides of the electronic carrier board, thereby greatly improving space utilization of the electronic carrier board. Compared with the electronic components used in the THT, the electronic components used in the SMT have smaller sizes such that more of these electronic components can be mounted on the electronic carrier board by the SMT, and also, the electronic components used in the SMT are more cost-effectively fabricated. These advantages make the SMT become the main technology for mounting electronic components on an electronic carrier board.

Moreover, in response to the electrical and functional requirements, it becomes necessary to mount passive components (such as capacitors, resistors or inductors) on an electronic carrier board to maintain stable electrical quality of an electronic product.

FIG. 1A is a top view showing passive components mounted on a substrate by the SMT, and FIGS. 1B and 1C are cross-sectional views of FIG. 1A taken along lines 1B-1B and 1C-1C respectively. As shown, a pair of separate bond pads 12 are formed at predetermined positions on a substrate 11, and are exposed through openings 130 of a solder mask layer 13 covering the substrate 11. With an appropriate amount of solder paste 15 being applied on the bond pads 12, two end portions of a passive component 14 can be bonded to the solder paste 15 and then subjected to a reflow soldering process, such that the passive component 14 is electrically connected to the bond pads 12 by means of the solder paste 15. In order to avoid a tombstone effect due to uneven amounts of the solder paste 15 applied to the two end portions of the passive component 14, the openings 130 of the solder mask layer 13 where the pair of bond pads 12 are exposed are made symmetrical in shape and equal in size so as to provide the solder paste 15 with same wetting areas on the bond pads 12.

However, for a semiconductor package, it is found difficult to accurately control the height of the passive component 14 bonded to the solder paste 15 due to the amount of the solder paste 15 being used and melting of the solder paste 15 in the reflow soldering process. In case the solder mask layer 13 does not have a flat surface but is usually formed with recesses, a clearance 17 may be generated between the passive component 14 and the solder mask layer 13. The height of the clearance 17 is merely 10 to 30 μm, which is smaller than the size (about 50 μm) of fillers of an epoxy molding compound (EMC) used for encapsulating the passive component 14. As such, in a molding process, the clearance 17 cannot be completely filled with the EMC, and thus voids are formed. The voids result in a popcorn effect in a subsequent high-temperature operating environment, which undesirably damages the whole package structure. Furthermore, the melting solder paste 15 may flow into the clearance 17 (by a capillary action) and lead to undesirable electrical bridging and short circuit of the passive component 14 (as shown in FIG. 1B), thereby adversely affecting the yield of the fabricated package structure.

With a plurality of passive components 14 being provided, the melting solder paste 15 may possibly flow through any gap between the bond pads 12 and the solder mask layer 13 and then through any gap between the substrate 11 and the solder mask layer 13 to form solder extrusion (as indicated by the sign SE in FIG. 1C), which results in short circuit between the adjacent passive components 14.

Accordingly, U.S. Pat. No. 6,521,997 provides a solution by additionally forming a groove 230 in a solder mask layer 23 and between openings of the solder mask layer 23 where a pair of bond pads 22 are exposed, as shown in FIG. 2A, so as to enlarge the clearance to allow the EMC to pass through the clearance by means of the groove 230.

However, the size of the groove 230 is limited by the low resolution of the photosensitive solder mask layer 23, such that the smallest width of the groove that can be formed is 150 μm. Moreover, owing to the limitation in photomask alignment precision of the openings through which the bond pads are exposed, the minimum width M of the solder mask layer formed at an edge of each bond pad and around the corresponding opening is 75 μm. This thereby makes it more difficult to form the groove between the bond pads when the component size is being reduced.

The dimensions (e.g. length and width) of a passive component are currently presented by two 2-digit numbers in the semiconductor industry, for example, 0603-type or 0402-type passive component, wherein both the length and width are typically measured in British unit (such as inch), and generally the first 2-digit number presents the larger dimension (i.e. length) followed by the second 2-digit number representing the smaller dimension (i.e. width). Taking the 0402-type passive component as an example, 0402 means the passive component having specific dimensions of 0.040 inch (length)× 0.020 inch (width), which if being converted into SI unit, correspond to a length of 0.040×25.4=1.016 mm (approximately 1000 μm) and a width of 0.020×25.4=0.508 mm (approximately 500 μm). The 0402-type passive component usually has a height of 500 μm, which can be a chip capacitor, resistor or inductor.

As shown in FIG. 2B, since semiconductor devices are being made with light weight and compact profile, a thin and fine ball grid array (TFBGA) semiconductor package has been downsized to have the thickness of an encapsulant reduced to 530 μm. Thus, the 0402-type chip passive component having a height of 500 μm becomes unable to be accommodated in such thin semiconductor package, but a smaller 0201-type chip passive component should be used instead so as to reduce the overall thickness of the package structure. The length, width and height of the 0201-type chip passive component are half of those of the 0402-type chip passive component, that is, the 0201-type chip passive component is of 500 μm (length)×250 μm (width)×250 μm (height). In light of the length (500 μm) of the small 0201-type chip passive component, spacing (A1) between two paired bond pads on a substrate has to be decreased from 400 μm to 275 μm.

As described above, the solder mask layer is typically made of a photosensitive material, and due to the low photosensitive resolution and the limitation in photomask alignment precision of openings, the solder mask layer formed at the edge of each bond pad and around the corresponding opening must be at least 75 μm wide. If the technology disclosed in U.S. Pat. No. 6,521,997 of forming a 150 μm-wide groove in the solder mask layers and between the paired bond pads is applied, as shown in FIG. 2B, the width A2 of the solder mask layer formed at the edge of each bond pad and around the corresponding opening becomes merely (275-150)/2=62.5 μm, which is smaller than the minimum width of 75 μm as required and thus goes beyond the capability of current technology.

Alternatively, as shown in FIG. 3A, U.S. Published Application No. 2005/0253231 discloses forming two solder mask openings 330 that expose corresponding sidewalls of two paired bond pads 32, and providing a barrier 331 between the two openings 330, such that two grooves 3300 are formed and allow the EMC to pass therethrough.

However, as limited by the low resolution of the photosensitive solder mask layer, the above technology is not feasible for forming the barrier 331 in the case of the spacing between adjacent bond pads being smaller than 275 μm, and thus is not applicable to the 0201-type passive component.

Further, if there is shifting of the solder mask layer, it would cause unequal wetting areas of the two bond pads in the above technology. As shown in FIG. 3B, assuming that an original bonding area of a bond pad (i.e. a surface area of a bond pad exposed through a solder mask opening) is sized A×B, if the solder mask layer is shifted to the left by X μm (the maximum shift is 75 μm for a conventional substrate fabrication process), the bonding area of the left bond pad becomes B×(A+X) and the bonding area of the right bond pad becomes B×(A−X), resulting in a difference of bonding area of B×(A+X)−B×(A−X)=2BX between the left bond pad and the right bond pad. The different bonding areas cause unequal wetting areas for the solder paste bonded to the bonds pads and lead to the tombstone effect as previously discussed.

Moreover, neither U.S. Pat. No. 6,521,997 nor U.S. Published Application No. 2005/0253231 as mentioned above is able to effectively solve the problem of short circuit between adjacent passive components due to solder extrusion formed by the solder paste flowing through any gap between the substrate and the solder mask layer.

Therefore, the problem to be solved here is to provide an electronic carrier board, which can avoid formation of voids, electrical bridging and solder extrusion in the presence of a clearance formed between the electronic carrier board and an electronic component mounted thereon, as well as prevent unequal exposed bonding areas of bond pads and the tombstone effect due to shifting of solder mask openings through which the bond pads are exposed.

SUMMARY OF THE INVENTION

In accordance with the foregoing drawbacks of the prior art, a primary objective of the present invention is to provide an electronic carrier board, so as to prevent unequal exposed bonding areas of two paired bond pads caused by imprecision-induced and error-induced shifting of openings that expose the bond pads.

Another objective of the present invention is to provide an electronic carrier board, so as to avoid a tombstone effect when an electronic component is mounted to the electronic carrier board.

Still another objective of the present invention is to provide an electronic carrier board, which allows an epoxy molding compound (EMC) to effectively fill a clearance between an electronic component and the electronic carrier board, so as to prevent the occurrence of a void-induced popcorn effect and electrical bridging.

A further objective of the present invention is to provide an electronic carrier board, which can prevent electrical short circuit between adjacent electronic components.

A further objective of the present invention is to provide an electronic carrier board, which can solve the problem of not able to form a groove for accommodating an EMC under a small passive component used in surface mounted technology (SMT).

In order to achieve the foregoing and other objectives, the present invention proposes an electronic carrier board, comprising: a carrier, at least two paired bond pads formed on a surface of the carrier, and a protective layer covering the surface of the carrier. The protective layer is formed with openings corresponding in position to the at least two bond pads respectively. The openings are aligned in the same direction relative to an alignment direction of the at least two bond pads and expose at least partially the two bond pads respectively in a manner that each of the two bond pads has at least its first and second sidewalls exposed through a corresponding one of the openings, wherein the exposed first and second sidewalls of one bond pad are identical to the exposed first and second sidewalls of the other bond pad respectively. The first sidewalls of the bond pads are perpendicular to the alignment direction of the bond pads, and the second sidewalls of the bond pads are parallel to the alignment direction of the bond pads. A distance between the first sidewall of at least one of the bond pads and a corresponding side of a corresponding one of the openings is at least 50 μm larger than a distance between the second sidewall of this bond pad and a corresponding side of the corresponding opening. Moreover, one of the openings is located relatively closer to a center of an electronic component when the electronic component is bonded to the two bond pads, wherein a distance between the first sidewall of the bond pad exposed through this opening and a corresponding side of this opening is at least 50 μm larger than a distance between the second sidewall of this bond pad and a corresponding side of this opening.

In another preferred embodiment, the openings of the protective layer are aligned in the same direction and expose at least partially the at least two bond pads respectively in a manner that each of the two bond pads has at least its first, second and third sidewalls exposed through a corresponding one of the openings, wherein the exposed first, second and third sidewalls of one bond pad are identical to the exposed first, second and third sidewalls of the other bond pad respectively. The first sidewalls of the bond pads are perpendicular to the alignment direction of the bond pads, and the second and third sidewalls of the bond pads are parallel to the alignment direction of the bond pads. A distance between the first sidewall of at least one of the bond pads and a corresponding side of a corresponding one of the openings is at least 50 μm larger than a distance between the second or third sidewall of this bond pad and a corresponding side of the corresponding opening.

In still another preferred embodiment, the openings of the protective layer are aligned in the same direction and expose completely the at least two bond pads respectively in a manner that each of the two bond pads has its first, second, third and fourth sidewalls exposed through a corresponding one of the openings, wherein the exposed first, second, third and fourth sidewalls of one bond pad are identical to the exposed first, second, third and fourth sidewalls of the other bond pad respectively. The first and fourth sidewalls of the bond pads are perpendicular to the alignment direction of the bond pads, and the second and third sidewalls of the bond pads are parallel to the alignment direction of the bond pads. A distance between the first sidewall of at least one of the bond pads and a corresponding side of a corresponding one of the openings is at least 50 μm larger than a distance between the second or third sidewall of this bond pad and a corresponding side of the corresponding opening.

In a further preferred embodiment, the openings of the protective layer are aligned in the same direction and expose at least partially the at least two bond pads respectively in a manner that each of the two bond pads has its first sidewall exposed through a corresponding one of the openings, wherein the exposed first sidewall of one bond pad is identical to the exposed first sidewall of the other bond pad. The first sidewalls of the bond pads are perpendicular to the alignment direction of the bond pads.

In a further preferred embodiment, the openings of the protective layer are aligned in the same direction and expose at least partially the at least two bond pads respectively in a manner that each of the two bond pads has its first and fourth sidewalls exposed through a corresponding one of the openings, wherein the exposed first and fourth sidewalls of one bond pad are identical to the exposed first and fourth sidewalls of the other bond pad respectively. The first and fourth sidewalls of the bond pads are perpendicular to the alignment direction of the bond pads.

In a further preferred embodiment, the two paired bond pads are different in size, and the openings of the protective layer are aligned in the same direction and expose the two bond pads respectively in a manner that, one of the two bond pads has its first, second, third and fourth sidewalls exposed and the other bond pad has its first and fourth sidewalls exposed. The first and fourth sidewalls are perpendicular to the alignment direction of the bond pads, and the second and third sidewalls are parallel to the alignment direction of the bond pads.

Accordingly, a package structure formed using the foregoing electronic carrier board of the present invention comprises: the electronic carrier board, an electronic component mounted on and electrically connected to the bond pads of the electronic carrier board, and an epoxy molding compound (EMC) encapsulating the electronic component and filling a space under the electronic component and the openings of the electronic carrier board. The electronic carrier board can be a substrate, a circuit board or a printed circuit board, etc. The protective layer can be a solder mask layer. The electronic component can be a passive component.

Therefore, the electronic carrier board of the present invention has a protective layer covering the electronic carrier board and formed with openings corresponding in position to at least two paired bond pads disposed on the electronic carrier board, wherein the openings are aligned in the same direction relative to an alignment direction of the two bond pads and expose sidewalls of the two bond pads. By such arrangement, even if the openings are shifted due to imprecision and error of a fabrication process, the exposed areas of the bond pads would remain the same, such that when subsequently an electronic component is mounted to the bond pads, a tombstone effect caused by unequal wetting areas provided for mounting the electronic component can be avoided.

The first sidewalls of the bond pads are exposed through the openings of the protective layer and are perpendicular to the alignment direction of the bond pads. This allows an EMC for encapsulating the electronic component to fill a space under the electronic component and fills the openings of the protective layer, thereby preventing a void-induced popcorn effect and electrical bridging. Further, besides the first sidewalls, the openings of the protective layer may also expose the second sidewalls of the two bond pads or the second and third sidewalls of the two bond pads, wherein the second and third sidewalls are parallel to the alignment direction of the bond pads, and a distance between the first sidewall and a corresponding side of a corresponding one of the openings is at least 50 μm larger than a distance between the second or third sidewall and a corresponding side of the corresponding one of the openings. By such arrangement, even if the openings are shifted, the exposed areas of the bonding pads remain the same, and the EMC (with an average filler size of 50 μm) for encapsulating the electronic component may fill a space under the electronic component and the openings of the protective layer, such that a void-induced popcorn effect and electrical bridging can be avoided. Also, the EMC may encapsulate at least one sidewall of each of the bond pads, thereby preventing solder extrusion and short circuit between adjacent electronic components.

Further, the openings of the protective layer, which are aligned in the same direction, may completely the first, second, third and fourth sidewalls of the at least two bond pads, wherein the first and fourth sidewalls are perpendicular to the alignment direction of the bond pads, and the second and third sidewalls are parallel to the alignment direction of the bond pads. A distance between the first sidewall and a corresponding side of a corresponding one of the openings is at least 50 μm larger than a distance between the second or third sidewall and a corresponding side of the corresponding one of the openings. As such, even if the openings are shifted, the bond pads 42 may still have the same exposed areas, thereby providing the predetermined bonding areas (wetting areas) of the bond pads for mounting an electronic device to the bond pads. This also allows the EMC for encapsulating the electronic component to fill a space under the electronic component and the openings of the protective layer, thereby preventing a void-induced popcorn effect and electrical bridging. Also, the EMC may completely encapsulate the sidewalls of the bond pads, such that solder extrusion is avoided.

Moreover, the openings of the protective layer, which are aligned in the same direction, may only expose the first sidewalls of the bond pads, wherein the first sidewalls are perpendicular to the alignment direction of the bond pads. By such arrangement, even if the openings are shifted due to imprecision and error of a fabrication process, the exposed areas of the bond pads would remain the same, such that when subsequently an electronic component is mounted to the bond pads, a tombstone effect caused by unequal wetting areas provided for mounting the electronic component can be avoided.

Furthermore, the openings of the protective layer may expose the first and fourth sidewalls of the bond pads. The first and fourth sidewalls are perpendicular to the alignment direction of the bond pads, and a distance between the first sidewall and a corresponding side of a corresponding one of the openings is at least about 50 μm larger than a distance between the fourth sidewall and a corresponding side of the corresponding one of the openings. As such, even if the openings are shifted, the bond pads may still have the same exposed areas, thereby providing the predetermined wetting areas of the bond pads for mounting an electronic device to the bond pads. This also allows the EMC for encapsulating the electronic component to fill a space under the electronic component and the openings of the protective layer, thereby preventing a void-induced popcorn effect and electrical bridging.

In addition, one of the openings of the protective layer completely exposes the first, second, third and fourth sidewalls of one of the at least two bond pads, and the other opening exposes the first and fourth sidewalls of the other bond pad, wherein a distance between the first sidewall and a corresponding side of a corresponding one of the openings is at least about 50 μm larger than a distance between the second, third or fourth sidewall and a corresponding side of a corresponding one of the openings. As such, even if the openings are shifted, the bond pads may still have the same exposed areas, thereby providing the predetermined wetting areas of the bond pads for mounting an electronic device to the bond pads. This also allows the EMC for encapsulating the electronic component to fill a space under the electronic component and the openings of the protective layer, thereby preventing a void-induced popcorn effect and electrical bridging.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of an electronic carrier board proposed in the present invention are described as follows with reference to FIGS. 4 to 11. It should be understood that the drawings are simplified schematic diagrams only showing the elements relevant to the present invention, and the layout of elements could be more complicated in practical implementation.

First Preferred Embodiment

Figure 1A:
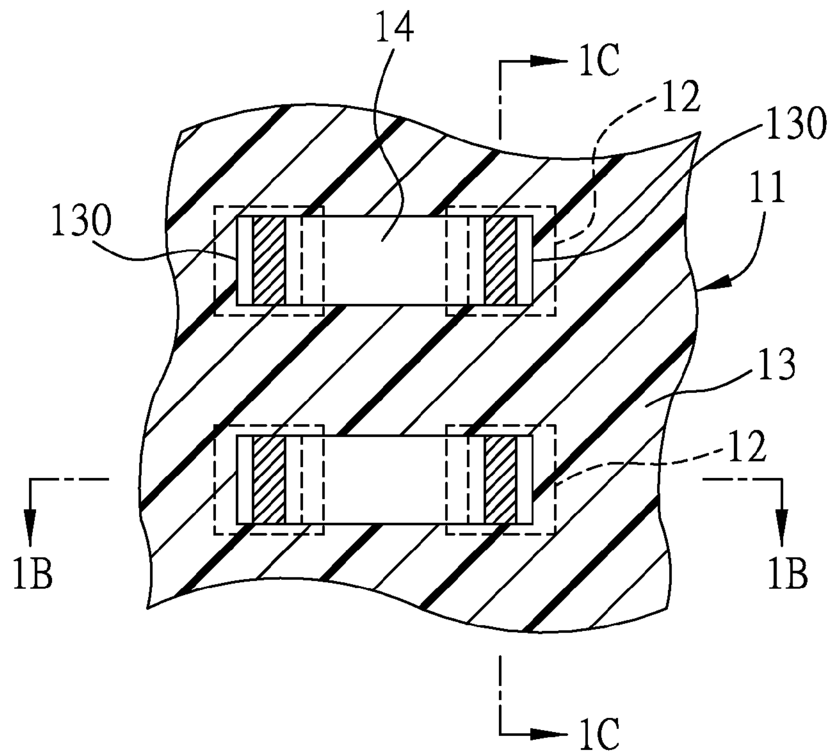
FIG. 1A (PRIOR ART) is a plan view showing passive components mounted on a substrate by SMT conventionally.
Figure 1B:
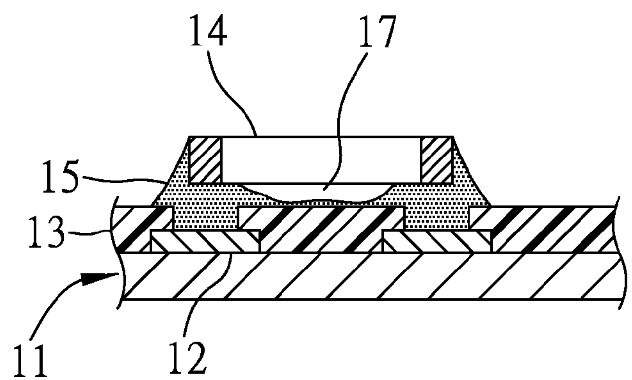
FIGS. 1B and 1C (PRIOR ART) are cross-sectional views of FIG. 1A taken along lines 1B-1B and 1C-1C respectively.
Figure 1C:
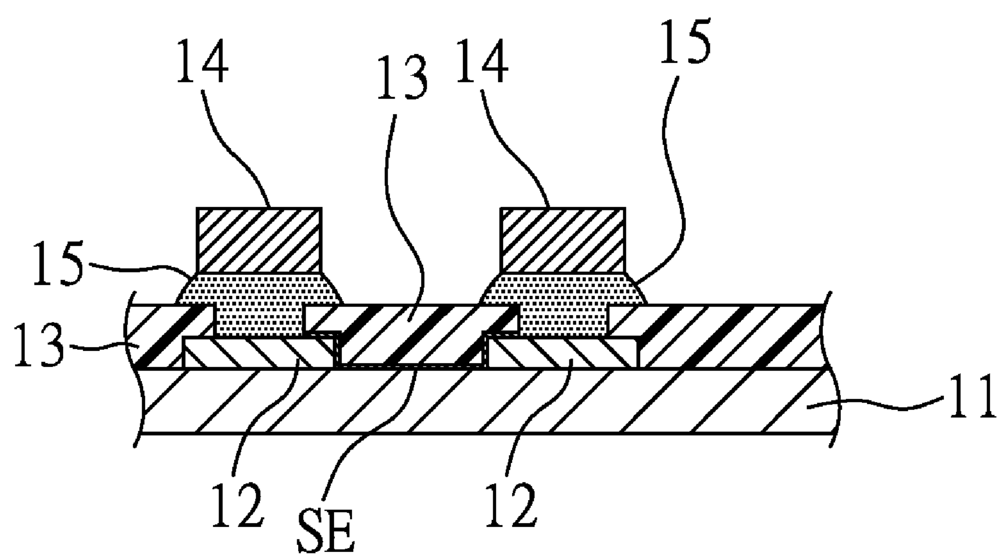
Figure 2A:
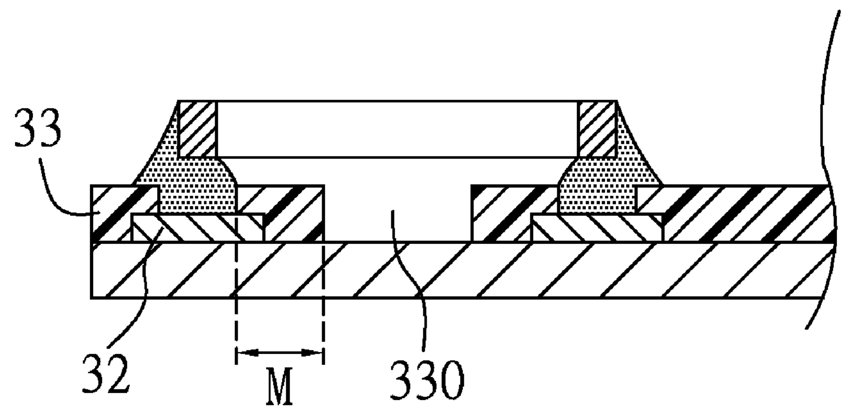
FIGS. 2A and 2B (PRIOR ART) are schematic views showing mounting of a passive component as disclosed in U.S. Pat. No. 6,521,997.
Figure 2B:
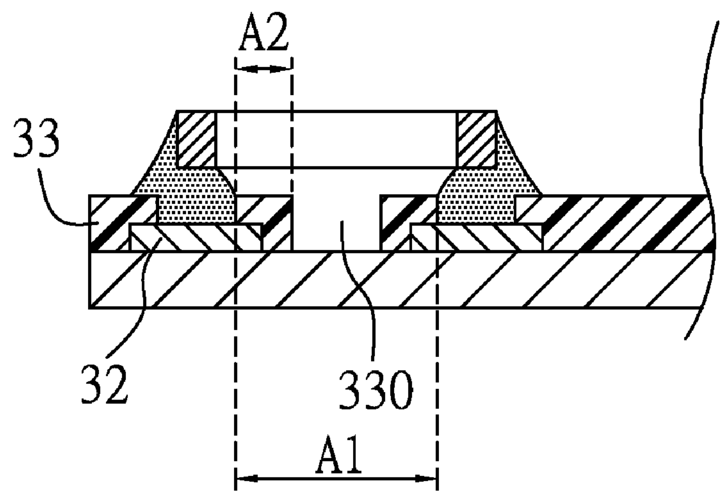
Figure 3A:
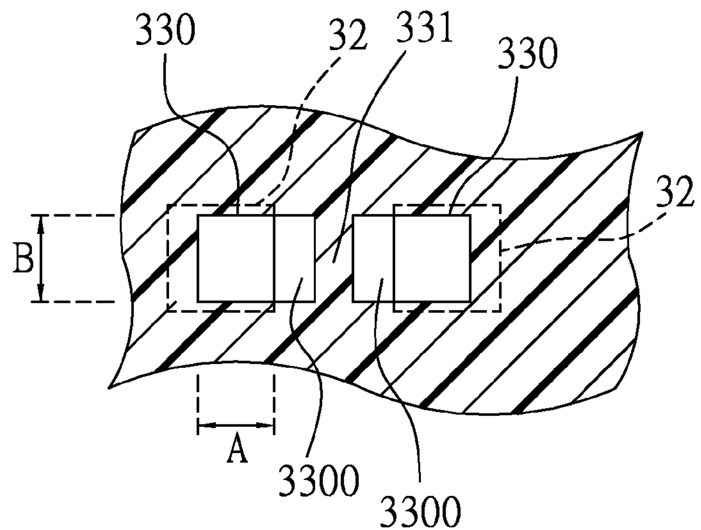
FIGS. 3A and 3B (PRIOR ART) are schematic views showing mounting of a passive component as disclosed in U.S. Patent No. 2005/0253231.
Figure 3B:
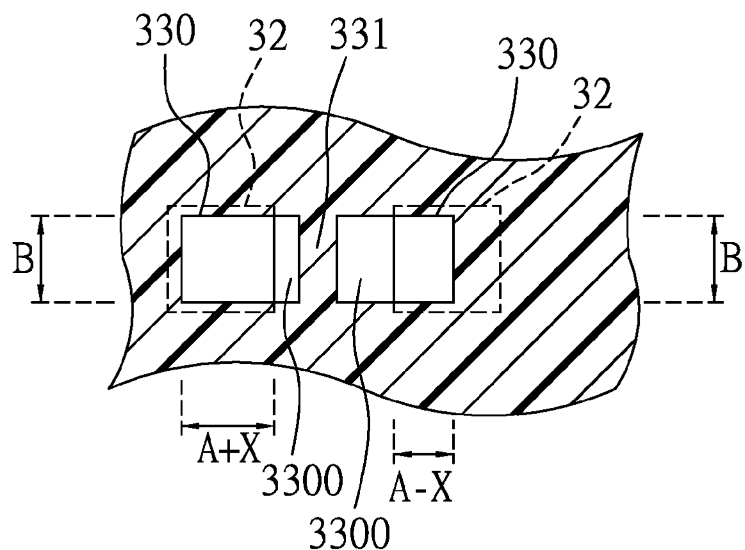
Figure 4A:
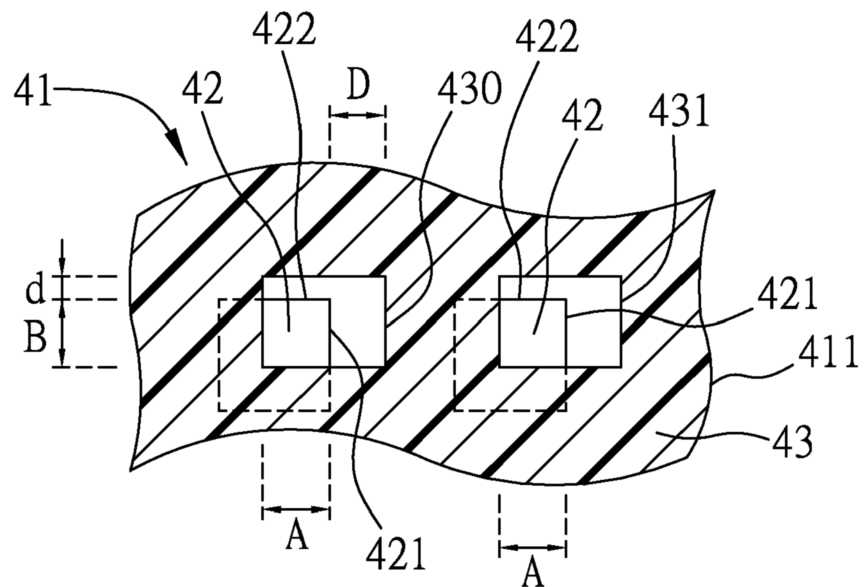
FIGS. 4A and 4B are plan views showing an electronic carrier board in accordance with a first preferred embodiment of the present invention.
Figure 4B:
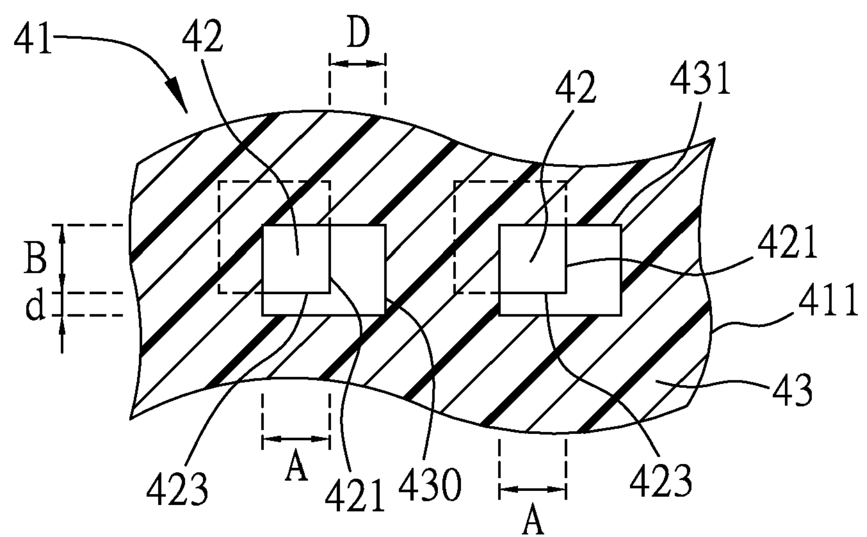

FIGS. 4A and 4B are plan views showing an electronic carrier board in accordance with a first preferred embodiment of the present invention.

The electronic carrier board of the present invention comprises: a carrier 411, at least two paired bond pads 42 formed on a surface of the carrier 411, and a protective layer 43 covering the surface of the carrier 411. The protective layer 43 is formed with openings 430, 431 corresponding in position to the two paired bond pads 42 respectively. The openings 430, 431 are aligned in the same direction relative to an alignment direction of the two bond pads 42. The openings 430, 431 expose a first sidewall 421 and a second sidewall 422 (or a third sidewall 423) of each of the two bond pads 42, wherein the exposed first sidewall 421 of one of the two bond pads 42 is identical to the exposed first sidewall 421 of the other bond pad 42, and the exposed second sidewall 422 (or third sidewall 423) of one of the two bond pads 42 is identical to the exposed second sidewall 422 (or third sidewall 423) of the other bond pad 42. The exposed first sidewall 421 has a width B and the exposed second sidewall 422 (or third sidewall 423) has a width A, such that each of the bond pads 42 has an area sized A×B exposed through a corresponding one of the openings 430, 431. The first sidewall 421 is perpendicular to the alignment direction of the bond pads 42, and the second sidewall 422 (or third sidewall 423) is parallel to the alignment direction of the bond pads 42. A distance D between the first sidewall 422 of at least one of the bond pads 42 and a corresponding side of a corresponding one of the openings 430, 431 is at least about 50 μm greater than a distance d between the second sidewall 422 (or third sidewall 423) of the at least one bond pad 42 and a corresponding side of the corresponding one of the openings 430, 431.

This embodiment exemplifies, but is not limited to, a process of having a protective layer (solder mask layer) with an alignment error of 75 μm as commonly adopted in the semiconductor industry. For example, in case the maximum alignment error is 75 μm, the distance d may be larger than or equal to 75 μm and the distance D may be larger than or equal to 125 μm; in case the maximum alignment error is 50 μm, the distance d may be larger than or equal to 50 μm and the distance D may be larger than or equal to 100 μm.

Figure 4C:
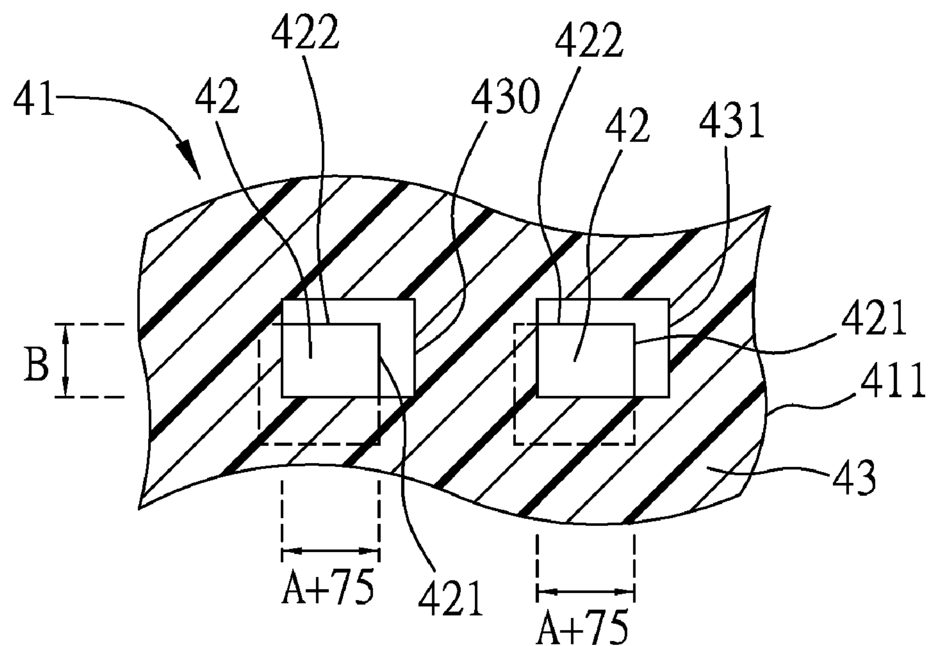
FIG. 4C is a plan view showing the electronic carrier board having a protective layer with openings thereof being shifted to the left in accordance with the first preferred embodiment of the present invention.

For example, if the openings 430, 431 are shifted to the left by 75 μm, the two bond pads still have the same exposed area sized (A+75)×B as shown in FIG. 4C. This thus provides bond pads with equal exposed bonding areas (wetting areas) for mounting an electronic component thereon, and allows a molding compound such as an epoxy molding compound (EMC) with an average filler size of 50 μm to encapsulate the electronic component and fill a space under the electronic component and the openings of the protective layer, such that a void-induced popcorn effect and electrical bridging are avoided. The EMC may also encapsulate at least one sidewall of each of the bond pads, thereby preventing solder extrusion and short circuit between adjacent electronic components.

The electronic carrier board 41 can be a package substrate for chip packaging, a circuit board, or a printed circuit board, etc. This embodiment is exemplified by a package substrate. The carrier 411 of the electronic carrier board 41 can be an insulating layer or an insulating layer with circuit layers stacked therein. A plurality of conductive circuits (not shown) and the bond pads 42 are disposed on the surface of the carrier 411. The insulating layer is made of a material such as glass fiber, epoxy resin, polyimide tape, FR4 resin or bismaleimide triazine (BT) resin. The circuit layers may comprise copper layers. The carrier 411 of the electronic carrier board 41 is covered with the protective layer 43, and the protective layer 43 can be a solder mask layer made of a polymer with high fluidity, such as epoxy resin.

Figure 4D:
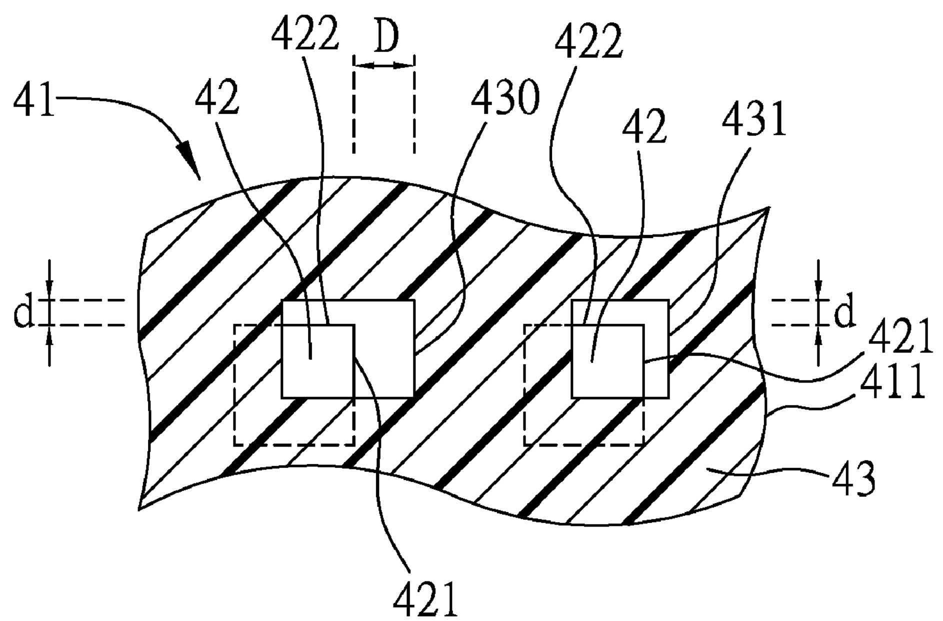
FIG. 4D is a plan view showing the electronic carrier board having the protective layer formed with openings of different dimensions in accordance with the first preferred embodiment of the present invention.

Referring to FIG. 4D, when an electronic component is mounted to the two bond pads during a subsequent process, in case an alignment error is 75 μm, for the opening 431 that is located relatively farther from a center of the electronic component then the opening 430, a distance between the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, for example, by 75 μm to the left, equal exposed bonding areas (wetting areas) of the bond pads can be provided for mounting the electronic component. Moreover, the EMC (with an average filler size of 50 μm) for encapsulating the electronic component may fill a space under the electronic component and the openings of the protective layer, thereby preventing a void-induced popcorn effect and electrical bridging. Also, the EMC may encapsulate at least one sidewall of each of the bond pads, such that solder extrusion and thus short circuit between adjacent electronic components can be avoided.

Second Preferred Embodiment

Figure 5:
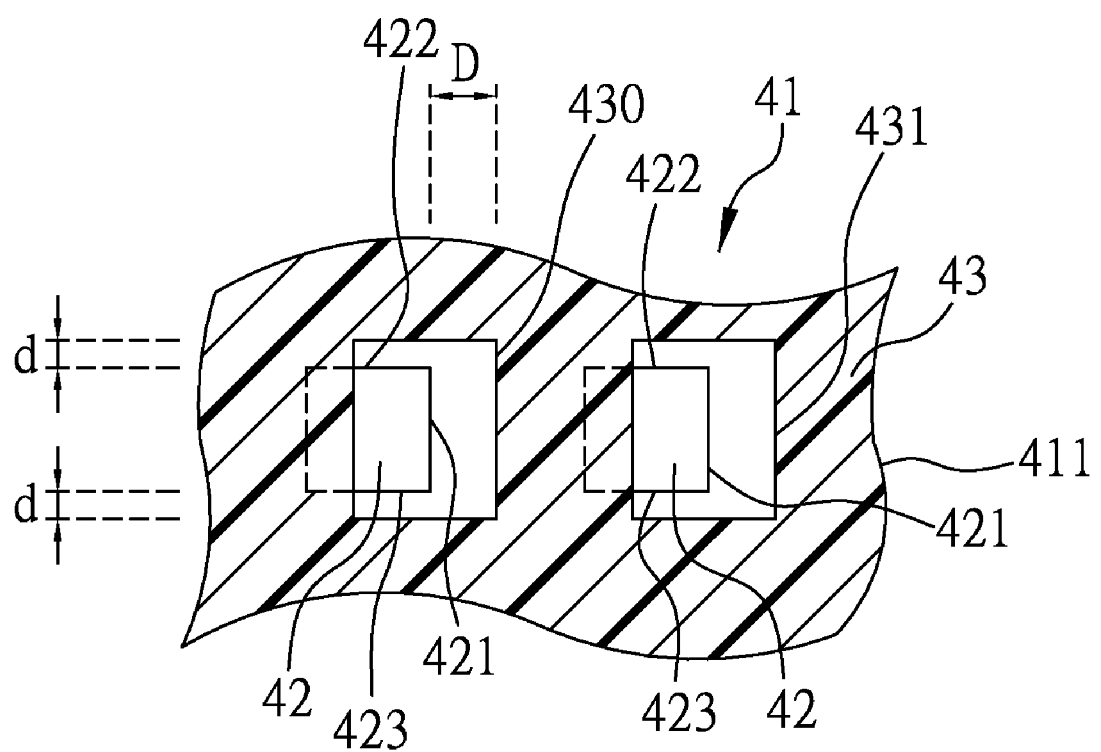
FIG. 5 is a plan view showing an electronic carrier board in accordance with a second preferred embodiment of the present invention.

FIG. 5 is a plan view showing an electronic carrier board in accordance with a second preferred embodiment of the present invention.

The electronic carrier board of the second embodiment is similar to that of the foregoing first embodiment, with a primary difference in that, in the second embodiment, the openings 430, 431 of the protective layer 43 of the electronic carrier board 41 are aligned in the same direction relative to the alignment direction of the at least two bond pads 42 and expose a first sidewall 421, a second sidewall 422 and a third sidewall 423 of each of the two bond pads 42, wherein the exposed first, second and third sidewalls 421, 422 and 423 of the one of the two bond pads 42 are identical to the exposed first, second and third sidewalls 421, 422 and 423 of the other bond pad 42 respectively. The first sidewalls 421 of the bond pads 42 are perpendicular to the alignment direction of the bond pads 42, and the second and third sidewalls 422 and 423 of the bond pads 42 are parallel to the alignment direction of the bond pads 42. A distance D between the first sidewall 421 of at least one of the bond pads 42 and a corresponding side of a corresponding one of the openings 430, 431 is at least about 50 μm greater than a distance d between each of the second and third sidewalls 422 and 423 of the at least one bond pad 42 and a corresponding side of the corresponding one of the openings 430, 431. The distance d is larger than or equal to 75 μm, and the distance D is larger than or equal to 125 μm. In case the maximum alignment error is 50 μm, the distance d may be larger than or equal to 50 μm and the distance D may be larger than or equal to 100 μm.

By the above arrangement, even if the openings 430, 431 are shifted, for example, by 75 μm to the left, equal exposed bonding areas (wetting areas) of the bond pads can be provided for mounting an electronic device to the bond pads, as described in the foregoing first embodiment. Moreover, the EMC (with an average filler size of 50 μm) for encapsulating the electronic component can fill a space under the electronic component and the openings of the protective layer, thereby preventing a void-induced popcorn effect and electrical bridging. Also, the EMC may encapsulate at least two sidewalls of each of the bond pads, such that solder extrusion and thus short circuit between adjacent electronic components can be avoided.

Accordingly, when an electronic component is mounted to the bond pads during a subsequent process, in case an alignment error is 75 μm, for the opening 431 that is located relatively farther from a center of the electronic component then the opening 430, a distance the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, equal exposed bonding areas (wetting areas) of the bond pads can be provided for mounting the electronic component. Moreover, the EMC (with an average filler size of 50 μm) for encapsulating the electronic component may fill a space under the electronic component and the openings of the protective layer, such that a void-induced popcorn effect and electrical bridging can be avoided. Also, the EMC may encapsulate at least two sidewalls of each of the bond pads, thereby preventing solder extrusion and short circuit between adjacent electronic components.

Third Preferred Embodiment

Figure 6A:
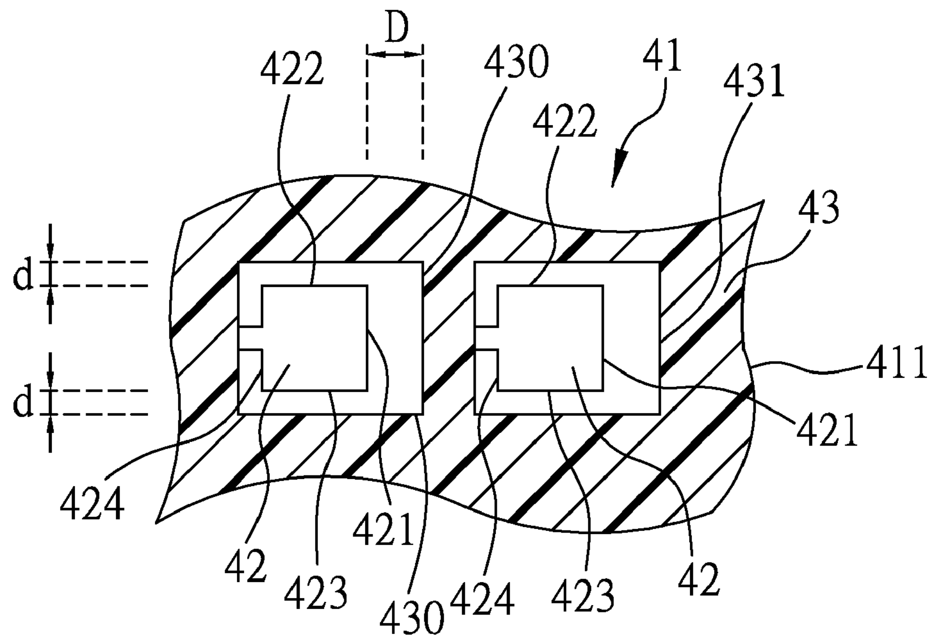
FIG. 6A is a plan view showing an electronic carrier board in accordance with a third preferred embodiment of the present invention.
Figure 6B:
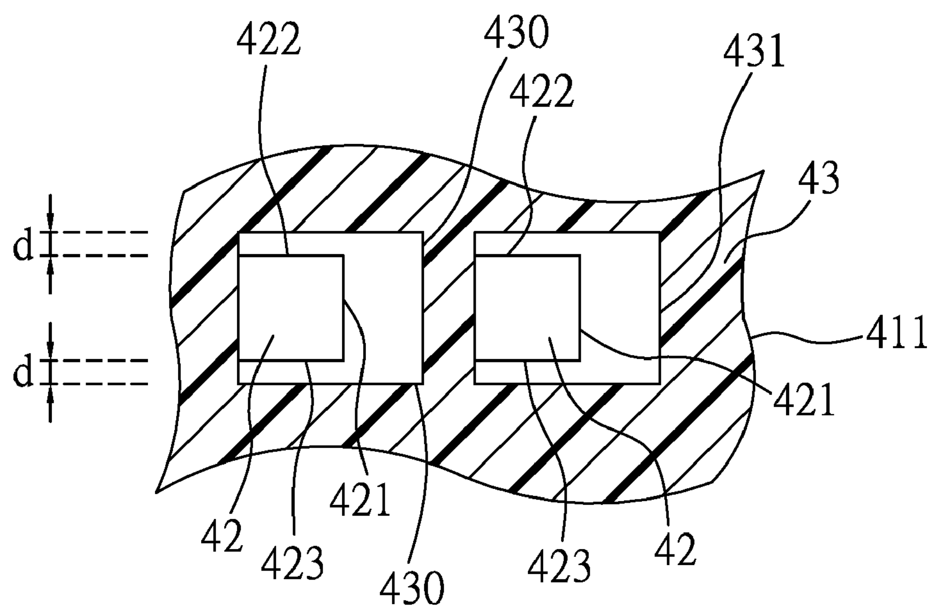
FIG. 6B is a plan view showing the electronic carrier board having a protective layer with openings thereof being shifted to the right in accordance with the third preferred embodiment of the present invention.

FIG. 6A is a plan view showing an electronic carrier board in accordance with a third preferred embodiment of the present invention. The electronic carrier board of the third embodiment is similar to that of the foregoing first embodiment, with a primary difference in that, in the third embodiment, the openings 430, 431 of the protective layer 43 are aligned in the same direction relative to the alignment direction of the at least two bond pads 42, and completely expose the two bond pads 42 respectively in a manner that, each of the two bond pads 42 has its first sidewall 421, second sidewall 422, third sidewall 423 and fourth sidewall 424 exposed through a corresponding one of the openings 430, 431, wherein the exposed first, second, third and fourth sidewalls 421, 422, 423, 424 of one of the two bond pads 42 are identical to the exposed first, second, third and fourth sidewalls 421, 422, 423, 424 of the other bond pad 42. The first and fourth sidewalls 421, 424 of the bond pads 42 are perpendicular to the alignment direction of the bond pads 42, and the second and third sidewalls 422, 423 of the bond pads 42 are parallel to the alignment direction of the paired bond pads 42. A distance D between the first sidewall 421 of at least one of the bond pads 42 and a corresponding side of a corresponding one of the openings 430, 431 is at least about 50 μm greater than a distance d between each of the second and third sidewalls 422, 423 of the at least one bond pad 42 and a corresponding side of the corresponding one of the openings 430, 431. The distance d is larger than or equal to 75 μm, and the distance D is larger than or equal to 125 μm. A distance the fourth sidewall 424 of at least one of the bond pads 42 and a corresponding side of a corresponding one of the openings 430, 431 is larger than or equal to 75 μm. In case the maximum alignment error is 50 μm, the distance d may be larger than or equal to 50 μm and the distance D may be larger than or equal to 100 μm.

By the above arrangement, even if the openings 430, 431 are shifted, for example, by 75 μm to the right, the bond pads 42 may still have the same exposed areas, thereby providing the predetermined bonding areas (wetting areas) of the bond pads for mounting an electronic device to the bond pads. This also allows the EMC for encapsulating the electronic component to fill a space under the electronic component and the openings of the protective layer, thereby preventing a void-induced popcorn effect and electrical bridging. Also, the EMC may completely encapsulate the sidewalls of the bond pads and thus solder extrusion is avoided.

Accordingly, when an electronic component is mounted to the bond pads during a subsequent process, in case an alignment error is 75 μm, for the opening 431 that is located relatively farther from a center of the electronic component then the opening 430, a distance the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, the predetermined exposed bonding areas (wetting areas) of the bond pads can be provided for mounting the electronic component. Moreover, the EMC for encapsulating the electronic component may fill a space under the electronic component and the openings of the protective layer, thereby preventing a void-induced popcorn effect and electrical bridging. Also, the EMC may completely encapsulate the sidewalls of the bond pads, such that solder extrusion is avoided.

Fourth Preferred Embodiment

Figure 7A:
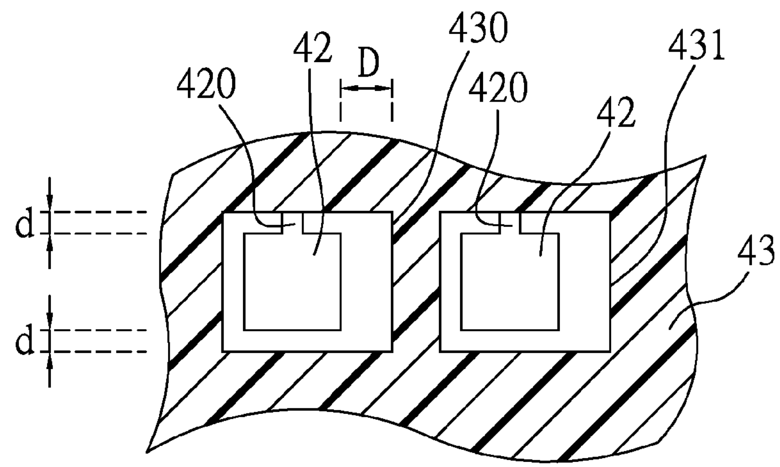
FIGS. 7A to 7C are plan views showing an electronic carrier board in accordance with a fourth preferred embodiment of the present invention.
Figure 7B:
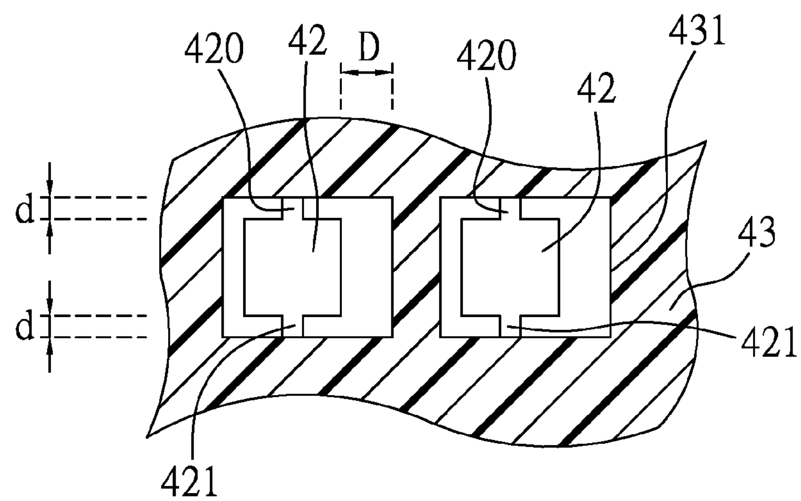
Figure 7C:
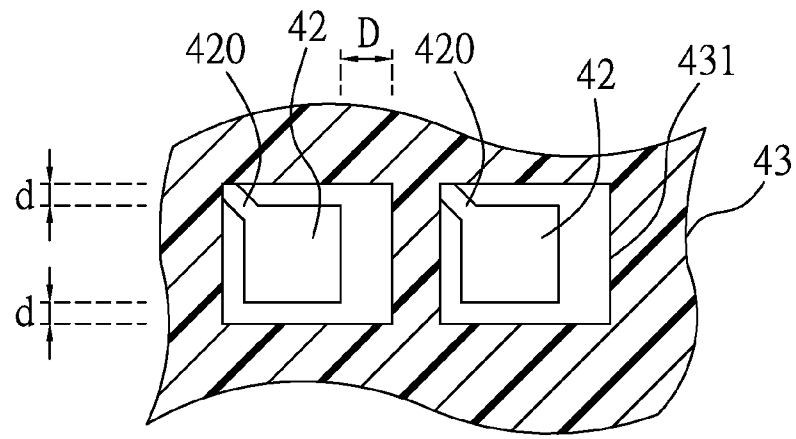

FIGS. 7A to 7C are plan views showing an electronic carrier board in accordance with a fourth preferred embodiment of the present invention.

The electronic carrier board of the fourth embodiment is similar to that of the foregoing third embodiment, with a primary difference in that, in the fourth embodiment, at least one conductive circuit 420 for electrically connecting each of the bond pads 42 to the electronic carrier board, besides being located on a left/right side of each bond pad 42 (as the case shown in FIG. 6A), may also be located at an upper side, a lower side, the upper and lower sides, or at least one corner of each bond pad 42 according to practical needs but not limited to the cases shown in the drawings. The provision of conductive circuit is also applicable to all other embodiments.

Figure 8A:
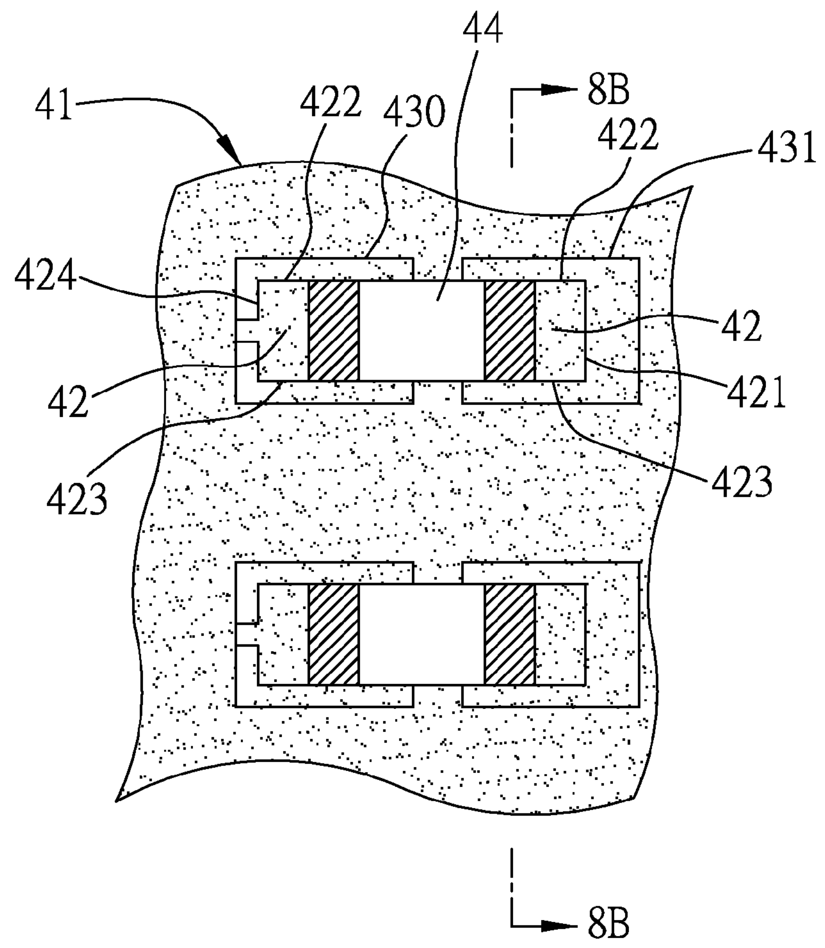
FIGS. 8A and 8B are a plan view and a cross-sectional view respectively showing a package structure using an electronic carrier board of the present invention.
Figure 8B:
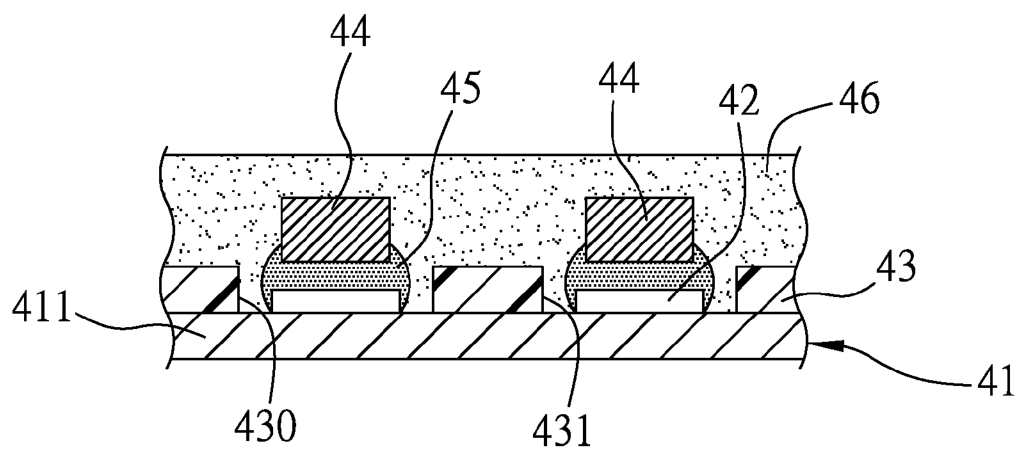

FIGS. 8A and 8B are a plan view and a cross-sectional view respectively showing a package structure using an electronic carrier board of the present invention. The package structure comprises: the electronic carrier board 41, at least one electronic component 44, and a molding compound such as an epoxy molding compound (EMC) 46. The electronic carrier board 41 can be any electronic carrier board disclosed in the foregoing embodiments, and the package structure is exemplified by, but not limited to, the electronic carrier board shown in FIG. 6. The electronic component 44 is mounted and electrically connected to the at least two bond pads 42 of the electronic carrier board 41. The EMC 46 encapsulates the electronic component 44 and fills a space under the electronic components 44 and the openings 430, 431 of the protective layer 43 of the electronic carrier board 41, and the EMC 46 may even encapsulate the sidewalls of the bond pads 42. The electronic carrier board 41 can be a substrate, a circuit board, or a printed circuit board, etc. The protective layer 43 can be a solder mask layer. The electronic component 44 can be a passive component.

The electronic component 44 can be mounted to the bond pads 42 by a conductive material 45 such as solder paste, and then a reflow soldering process is performed such as the electronic component 44 is electrically connected to the bond pads 42 via the solder paste.

Using the electronic carrier board 41 of the present invention, even if the openings of the protective layer are shifted, for example, by 75 μm to the top, bottom, left or right due to imprecise and error of a fabrication process, the exposed areas of the bond pads 42 do not change accordingly. In this embodiment, since all the four sidewalls of each of the bond pads 42 are exposed through the openings, the EMC 46 may completely encapsulate all the sidewalls of the bond pads 42. This solves the problem of short circuit between adjacent passive components due to solder extrusion caused by solder paste flowing through any gap between a bond pad and a solder mask layer and then through any gap between a substrate and the solder mask layer in the prior art.

Fifth Preferred Embodiment

Figure 9:
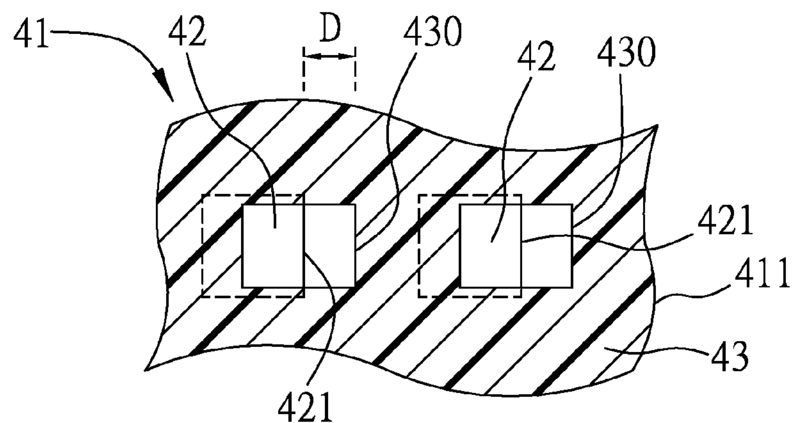
FIG. 9 is a plan view showing an electronic carrier board in accordance with a fifth preferred embodiment of the present invention.

FIG. 9 is a plan view showing an electronic carrier board in accordance with a fifth preferred embodiment of the present invention.

As shown in FIG. 9, the electronic carrier board 41 of the present invention comprises: a carrier 411, at least two paired bond pads 42 formed on a surface of the carrier 411, and a protective layer 43 covering the surface of the carrier 411. The two bond pads 42 have the same dimensions. The protective layer 43 is formed with openings 430, 431 corresponding in position to the two bond pads 42. The openings 430, 431 are aligned in the same direction relative to an alignment direction of the paired bond pads 42. A first sidewall 421 of each of the two bond pads 42 is exposed through a corresponding one of the openings 430, 431, wherein the exposed first sidewall 421 of one of the two bond pads 42 is identical to the exposed first sidewall 421 of the other bond pad 42. The first sidewalls 421 of the bond pads 42 are perpendicular to the alignment direction of the bond pads 42.

A distance D between the first sidewall 421 of at least one of the bond pads 42 and a corresponding side of the corresponding one of the openings 430, 431 can be larger than or equal to 125 μm. In case the maximum alignment error is 50 μm, the distance D is larger than or equal to 100 μm.

Even if the openings 430, 431 of the protective layer 43 (such as solder mask layer) are shifted due to imprecision and error of a fabrication process, areas of the bond pads 42 exposed through the openings 430, 431 would remain the same, such that when subsequently an electronic component is mounted to the bond pads 42, a tombstone effect caused by unequal wetting areas provided for mounting the electronic component can be avoided.

If the openings 430, 431 of the protective layer 43 are shifted by 75 μm to the left, the distance D between the first sidewall 421 and the corresponding side of the opening 430 is changed to be 50 μm (or greater), and the EMC (with an average filler size of 50 μm) for encapsulating the electronic component can still fill a space under the electronic components and the opening 430, thereby preventing a void-induced popcorn effect and electrical bridging.

Further in case an alignment error is 75 μm, for the opening 431 that is located relatively farther from a center of the electronic component then the opening 430, a distance the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, the exposed areas of the bond pads 42 do not change and thus a tombstone effect caused by unequal wetting areas provided for mounting the electronic component can be avoided.

Sixth Preferred Embodiment

Figure 10:
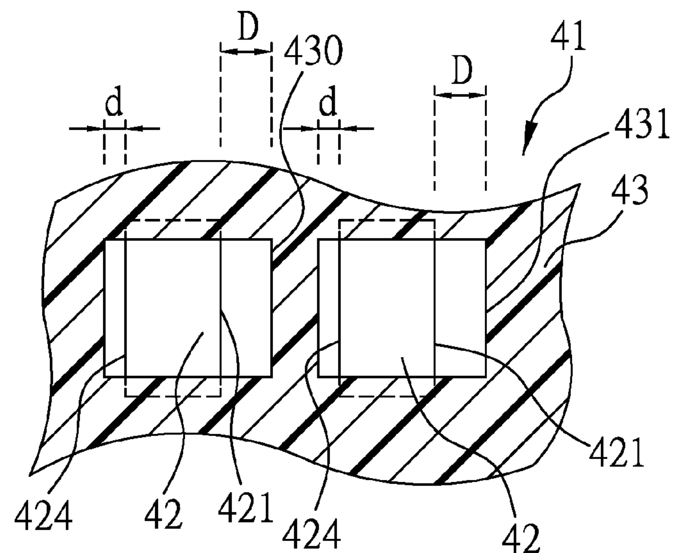
FIG. 10 is a plan view showing an electronic carrier board in accordance with a sixth preferred embodiment of the present invention.

FIG. 10 is a plan view showing an electronic carrier board in accordance with a sixth preferred embodiment of the present invention.

The electronic carrier board of the sixth embodiment is similar to that of the first embodiment, wherein the openings 430, 431 of the protective layer 43 are still aligned in the same direction. Differently, in the sixth embodiment, the openings 430, 431 expose a first sidewalls 421 and a fourth sidewalls 424 of each of the at least two bond pads 42, wherein the exposed first and fourth sidewalls 421, 424 of one of the two bond pads 42 are identical to the exposed first and fourth sidewalls 421, 424 of the other bond pad 42. The first and fourth sidewalls 421, 424 of the bond pads 42 are perpendicular to the alignment direction of the bond pads 42. A distance D between the first sidewall 421 of at least one of the bond pads 42 and a corresponding side of a corresponding one of the openings 430, 431 is at least about 50 μm larger than a distance d between the fourth sidewall 424 of the at least one bond pad 42 and a corresponding side of the corresponding one of the openings 430, 431. The distance d is larger than or equal to 75 μm, and the distance D is larger than or equal to 125 μm. In case the maximum alignment error is 50 μm, the distance d may be larger than or equal to 50 μm and the distance D may be larger than or equal to 100 μm.

By the above arrangement, even if the openings 430, 431 are shifted (to the left, right, top or bottom), the bond pads 42 may still have the same exposed areas, thereby providing the predetermined bonding areas (wetting areas) of the bond pads for mounting an electronic device to the bond pads. This also allows the EMC for encapsulating the electronic component to fill a space under the electronic component and the openings of the protective layer, thereby preventing a void-induced popcorn effect and electrical bridging.

Accordingly, when an electronic component is mounted to the bond pads during a subsequent process, in case an alignment error is 75 μm, for the opening 431 that is located relatively farther from a center of the electronic component then the opening 430, a distance the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, the predetermined exposed bonding areas (wetting areas) of the bond pads can be provided for mounting the electronic component. Moreover, the EMC for encapsulating the electronic component may fill a space under the electronic component and the openings of the protective layer, thereby preventing a void-induced popcorn effect and electrical bridging.

Seventh Preferred Embodiment

Figure 11:
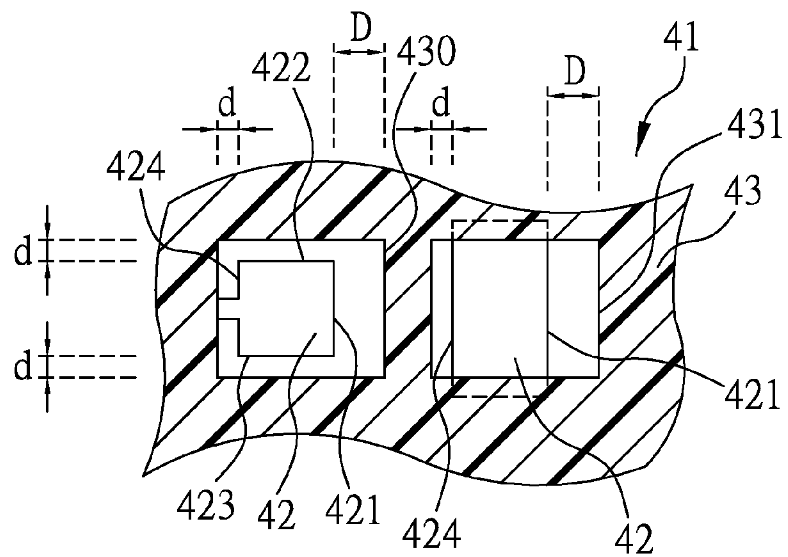
FIG. 11 is a plan view showing an electronic carrier board in accordance with a seventh preferred embodiment of the present invention.

FIG. 11 is a plan view showing an electronic carrier board in accordance with a seventh embodiment of the present invention.

In this embodiment, it is applicable to combine the arrangement of the bond pads and the openings of the protective layer of the foregoing third and sixth embodiments of the present invention.

As shown FIG. 11, the at least two paired bond pads 42 on the electronic carrier board 41 can be different in plan view size from each other, and the openings 430, 431 of the protective layer 43 are aligned in the same direction relative to the alignment direction of the two bond pads 42. The opening 430 completely exposes a first sidewall 421, a second sidewall 422, a third sidewall 423 and a fourth sidewall 424 of a corresponding one of the bond pads 42 (the left bond pad 42), and the opening 431 exposes a first sidewall 421 and a fourth sidewall 424 of the other one of the bond pads 42 (the right bond pad 42). A distance D between the first sidewall 421 and a corresponding side of a corresponding one of the openings 430, 431 is at least about 50 μm larger than a distance d between the second sidewall 422, the third sidewall 423 or the fourth sidewall 424 and a corresponding side of a corresponding one of the openings 430, 431. The distance d is larger than or equal to 75 μm, and the distance D is larger than or equal to 125 μm. In case the maximum alignment error is 50 μm, the distance d may be larger than or equal to 50 μm and the distance D may be larger than or equal to 100 μm.

By the above arrangement, even if the openings 430, 431 are shifted (to the left, right, top or bottom), the bond pads 42 may still have the same exposed areas, thereby providing the predetermined bonding areas (wetting areas) of the bond pads for mounting an electronic device to the bond pads. This also allows the EMC for encapsulating the electronic component to fill a space under the electronic component and the openings of the protective layer, thereby preventing a void-induced popcorn effect and electrical bridging.

Accordingly, when an electronic component is mounted to the bond pads during a subsequent process, in case an alignment error is 75 μm, for the opening 431 that is located relatively farther from a center of the electronic component then the opening 430, a distance the first sidewall 421 of a corresponding one of the bond pads 42 and a corresponding side of the opening 431 can be larger than or equal to 75 μm (or in case the alignment error is 50 μm, this distance can be larger than or equal to 50 μm). As such, even if the openings 430, 431 are shifted, the predetermined exposed bonding areas (wetting areas) of the bond pads can be provided for mounting the electronic component. Moreover, the EMC for encapsulating the electronic component may fill a space under the electronic component and the openings of the protective layer, thereby preventing a void-induced popcorn effect and electrical bridging.

Therefore, the electronic carrier board of the present invention has a protective layer covering the electronic carrier board and formed with openings corresponding in position to at least two paired bond pads disposed on the electronic carrier board, wherein the openings are aligned in the same direction relative to an alignment direction of the two bond pads and expose sidewalls of the two bond pads. By such arrangement, even if the openings are shifted due to imprecision and error of a fabrication process, the exposed areas of the bond pads would remain the same, such that when subsequently an electronic component is mounted to the bond pads, a tombstone effect caused by unequal wetting areas provided for mounting the electronic component can be avoided.

The first sidewalls of the bond pads are exposed through the openings of the protective layer and are perpendicular to the alignment direction of the bond pads. This allows an EMC for encapsulating the electronic component to fill a space under the electronic component and fills the openings of the protective layer, thereby preventing a void-induced popcorn effect and electrical bridging. Further, besides the first sidewalls, the openings of the protective layer may also expose the second sidewalls of the two bond pads or the second and third sidewalls of the two bond pads, wherein the second and third sidewalls are parallel to the alignment direction of the bond pads, and a distance between the first sidewall and a corresponding side of a corresponding one of the openings is at least 50 μm larger than a distance between the second or third sidewall and a corresponding side of the corresponding one of the openings. By such arrangement, even if the openings are shifted, the exposed areas of the bonding pads remain the same, and the EMC (with an average filler size of 50 μm) for encapsulating the electronic component may fill a space under the electronic component and the openings of the protective layer, such that a void-induced popcorn effect and electrical bridging can be avoided. Also, the EMC may encapsulate at least one sidewall of each of the bond pads, thereby preventing solder extrusion and short circuit between adjacent electronic components.

Further, the openings of the protective layer, which are aligned in the same direction, may completely the first, second, third and fourth sidewalls of the at least two bond pads, wherein the first and fourth sidewalls are perpendicular to the alignment direction of the bond pads, and the second and third sidewalls are parallel to the alignment direction of the bond pads. A distance between the first sidewall and a corresponding side of a corresponding one of the openings is at least 50 μm larger than a distance between the second or third sidewall and a corresponding side of the corresponding one of the openings. As such, even if the openings are shifted, the bond pads 42 may still have the same exposed areas, thereby providing the predetermined bonding areas (wetting areas) of the bond pads for mounting an electronic device to the bond pads. This also allows the EMC for encapsulating the electronic component to fill a space under the electronic component and the openings of the protective layer, thereby preventing a void-induced popcorn effect and electrical bridging. Also, the EMC may completely encapsulate the sidewalls of the bond pads, such that solder extrusion is avoided.

Moreover, the openings of the protective layer, which are aligned in the same direction, may only expose the first sidewalls of the bond pads, wherein the first sidewalls are perpendicular to the alignment direction of the bond pads. By such arrangement, even if the openings are shifted due to imprecision and error of a fabrication process, the exposed areas of the bond pads would remain the same, such that when subsequently an electronic component is mounted to the bond pads, a tombstone effect caused by unequal wetting areas provided for mounting the electronic component can be avoided.

Furthermore, the openings of the protective layer may expose the first and fourth sidewalls of the bond pads. The first and fourth sidewalls are perpendicular to the alignment direction of the bond pads, and a distance between the first sidewall and a corresponding side of a corresponding one of the openings is at least about 50 μm larger than a distance between the fourth sidewall and a corresponding side of the corresponding one of the openings. As such, even if the openings are shifted, the bond pads may still have the same exposed areas, thereby providing the predetermined wetting areas of the bond pads for mounting an electronic device to the bond pads. This also allows the EMC for encapsulating the electronic component to fill a space under the electronic component and the openings of the protective layer, thereby preventing a void-induced popcorn effect and electrical bridging.

In addition, one of the openings of the protective layer completely exposes the first, second, third and fourth sidewalls of one of the at least two bond pads, and the other opening exposes the first and fourth sidewalls of the other bond pad, wherein a distance between the first sidewall and a corresponding side of a corresponding one of the openings is at least about 50 μm larger than a distance between the second, third or fourth sidewall and a corresponding side of a corresponding one of the openings. As such, even if the openings are shifted, the bond pads may still have the same exposed areas, thereby providing the predetermined wetting areas of the bond pads for mounting an electronic device to the bond pads. This also allows the EMC for encapsulating the electronic component to fill a space under the electronic component and the openings of the protective layer, thereby preventing a void-induced popcorn effect and electrical bridging.

The present invention is illustrated with exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electronic carrier board comprising:

a carrier;

at least two paired bond pads formed on a surface of the carrier; and a protective layer covering the surface of the carrier and formed with openings corresponding in position to the at least two bond pads, wherein the openings are aligned in a same direction relative to an alignment direction of the at least two bond pads and expose at least a first sidewall and a second sidewall of each of the at least two bond pads, with the exposed first and second sidewalls of one of the at least two bond pads being identical to the exposed first and second sidewalls of the other one of the at least two bond pads, and wherein the first sidewalls of the bond pads are perpendicular to the alignment direction of the bond pads, and the second sidewalls of the bond pads are parallel to the alignment direction of the bond pads, and wherein a distance between the first sidewall of each of the bond pads and a corresponding side of a corresponding one of the openings is at least 50 μm larger than a distance between the second sidewall of each of the bond pads and a corresponding side of the corresponding opening.

2. The electronic carrier board of claim 1, wherein the bond pads allow solder paste to be applied thereon so as to electrical connect an electronic component to the bond pads via the solder paste, and one of the openings is located relatively closer to a center of the electronic component and has a distance to the first sidewall of a corresponding one of the bond pads larger than a distance to the second sidewall of the corresponding bond pad by at least 50 μm.

3. The electronic carrier board of claim 2, wherein the electronic component is a passive component, allowing a molding compound to encapsulate the passive component and fill a space under the passive components and the openings of the protective layer.

4. The electronic carrier board of claim 1, wherein at least one of the bond pads has a distance of at least 125 μm between its first sidewall and a corresponding side of a corresponding one of the openings, and has a distance of at least 75 μm between its second sidewall and a corresponding side of the corresponding opening.

5. The electronic carrier board of claim 4, wherein the bond pads are for mounting an electronic component thereon, and one of the openings is located relatively farther from a center of the electronic component and has a distance of at least 75 μm between a corresponding side thereof and the first sidewall of a corresponding one of the bond pads.

6. The electronic carrier board of claim 1, wherein at least one of the bond pads has a distance of at least 100 μm between its first sidewall and a corresponding side of a corresponding one of the openings, and has a distance of at least 50 μm between its second sidewall and a corresponding side of the corresponding opening.

7. The electronic carrier board of claim 6, wherein the bond pads are for mounting an electronic component thereon, and one of the openings is located relatively farther from a center of the electronic component and has a distance of at least 50 μm between a corresponding side thereof and the first sidewall of a corresponding one of the bond pads.

8. The electronic carrier board of claim 1, wherein the openings further exposes a third sidewall of each of the at least two bond pads, and the exposed third sidewall of one of the at least two bond pads is identical to the exposed third sidewall of the other one of the at least two bond pads, and wherein the third sidewalls of the bond pads are parallel to the alignment direction of the bond pads, and a distance between the first sidewall of at least one of the bond pads and a corresponding side of a corresponding one of the openings is at least 50 μm larger than a distance between each of the second and third sidewalls of the at least one bond pad and a corresponding side of the corresponding opening.

9. An electronic carrier board comprising:

a carrier;

at least two paired bond pads formed on a surface of the carrier; and a protective layer covering the surface of the carrier and formed with openings corresponding in position to the at least two bond pads, wherein the openings are aligned in a same direction relative to an alignment direction of the at least two bond pads and completely expose a first sidewall, a second sidewall, a third sidewall and a fourth sidewall of each of the at least two bond pads, with the exposed first, second, third and fourth sidewalls of one of the at least two bond pads being identical to the exposed first, second, third and fourth sidewalls of the other one of the at least two bond pads, and wherein the first and fourth sidewalls of the bond pads are perpendicular to the alignment direction of the bond pads, and the second and third sidewalls of the bond pads are parallel to the alignment direction of the bond pads, and wherein a distance between the first sidewall of each of the bond pads and a corresponding side of a corresponding one of the openings is at least 50 μm larger than a distance between each of the second and third sidewalls of each of the bond pads and a corresponding side of the corresponding opening.

10. The electronic carrier board of claim 9, wherein the bond pads allow solder paste to be applied thereon so as to electrical connect an electronic component to the bond pads via the solder paste, and one of the openings is located relatively closer to a center of the electronic component and has a distance to the first sidewall of a corresponding one of the bond pads larger than a distance to the second sidewall of the corresponding bond pad by at least 50 μm.

11. The electronic carrier board of claim 10, wherein the electronic component is a passive component, allowing a molding compound to encapsulate the passive component and fill a space under the passive components and the openings of the protective layer.

12. The electronic carrier board of claim 9, wherein at least one of the bond pads has a distance of at least 125 μm between its first sidewall and a corresponding side of a corresponding one of the openings, and has a distance of at least 75 μm between its second sidewall and a corresponding side of the corresponding opening.

13. The electronic carrier board of claim 12, wherein the bond pads are for mounting an electronic component thereon, and one of the openings is located relatively farther from a center of the electronic component and has a distance of at least 75 μm between a corresponding side thereof and the first sidewall of a corresponding one of the bond pads.

14. The electronic carrier board of claim 9, wherein at least one of the bond pads has a distance of at least 100 μm between its first sidewall and a corresponding side of a corresponding one of the openings, and has a distance of at least 50 μm between its second sidewall and a corresponding side of the corresponding opening.

15. The electronic carrier board of claim 14, wherein the bond pads are for mounting an electronic component thereon, and one of the openings is located relatively farther from a center of the electronic component and has a distance of at least 50 μm between a corresponding side thereof and the first sidewall of a corresponding one of the bond pads.

16. The electronic carrier board of claim 9, further comprising at least one conductive circuit disposed on the surface of the carrier, wherein the at least one conductive circuit is located at one of a left side, a right side, an upper side, a lower side, the upper and lower sides, and at least one corner of at least one of the bond pads.

17. An electronic carrier board comprising:

a carrier;

at least two paired bond pads formed on a surface of the carrier; and a protective layer covering the surface of the carrier and formed with openings corresponding in position to the at least two bond pads, wherein the openings are aligned in a same direction relative to an alignment direction of the at least two bond pads and expose only a first sidewall of each of the at least two bond pads, and wherein the exposed first sidewall of one of the at least two bond pads is identical to the exposed first sidewall of the other one of the at least two bond pads, and the first sidewalls of the bond pads are perpendicular to the alignment direction of the bond pads.

18. The electronic carrier board of claim 17, wherein the bond pads allow solder paste to be applied thereon so as to electrical connect an electronic component to the bond pads via the solder paste.

19. The electronic carrier board of claim 18, wherein the electronic component is a passive component, allowing a molding compound to encapsulate the passive component and fill a space under the passive components and the openings of the protective layer.

20. The electronic carrier board of claim 17, wherein at least one of the bond pads has a distance of at least 125 μm between its first sidewall and a corresponding side of a corresponding one of the openings.

21. The electronic carrier board of claim 20, wherein the bond pads are for mounting an electronic component thereon, and one of the openings is located relatively farther from a center of the electronic component and has a distance of at least 75 μm between a corresponding side thereof and the first sidewall of a corresponding one of the bond pads.

22. The electronic carrier board of claim 17, wherein at least one of the bond pads has a distance of at least 100 μm between its first sidewall and a corresponding side of a corresponding one of the openings.

23. The electronic carrier board of claim 22, wherein the bond pads are for mounting an electronic component thereon, and one of the openings is located relatively farther from a center of the electronic component and has a distance of at least 50 μm between a corresponding side thereof and the first sidewall of a corresponding one of the bond pads.

* * * * *